United States Patent
Tanida et al.

(10) Patent No.: US 8,115,156 B2
(45) Date of Patent: Feb. 14, 2012

(54) OPTICAL CONDITION DESIGN METHOD FOR A COMPOUND-EYE IMAGING DEVICE

(75) Inventors: Jun Tanida, Suita (JP); Ryoichi Horisaki, Suita (JP); Yoshizumi Nakao, Daito (JP); Takashi Toyoda, Daito (JP); Yasuo Masaki, Daito (JP)

(73) Assignees: Funai Electric Co., Ltd., Daito-shi (JP); Osaka University, Suita-shi (JP)

( * ) Notice: Subject to any disclaimer, the term of this patent is extended or adjusted under 35 U.S.C. 154(b) by 361 days.

(21) Appl. No.: 12/551,088

(22) Filed: Aug. 31, 2009

(65) Prior Publication Data

US 2010/0053600 A1    Mar. 4, 2010

(30) Foreign Application Priority Data

Sep. 1, 2008  (JP) ................................ 2008-223979

(51) Int. Cl.
*H01L 27/00*  (2006.01)
(52) U.S. Cl. .............. 250/208.1; 250/214.1; 250/214 R; 359/619
(58) Field of Classification Search ............... 250/208.1, 250/214.1, 214 R; 359/619
See application file for complete search history.

(56) References Cited

U.S. PATENT DOCUMENTS

| 7,297,926 | B2 * | 11/2007 | Kaluzhny | 250/214.1 |
| 7,501,610 | B2 * | 3/2009 | Nakao et al. | 250/208.1 |
| 7,525,081 | B2 * | 4/2009 | Toyoda et al. | 250/208.1 |
| 7,529,383 | B2 * | 5/2009 | Miyatake et al. | 250/208.1 |
| 7,700,904 | B2 * | 4/2010 | Toyoda et al. | 250/208.1 |

FOREIGN PATENT DOCUMENTS

JP    2001-61109 A    3/2001

* cited by examiner

*Primary Examiner* — Seung C Sohn
(74) *Attorney, Agent, or Firm* — Crowell & Moring LLP

(57) ABSTRACT

An imaginary object plane is set in front of an imaging device body (plane setting step). A part of optical conditions of optical lenses are changed as variables, and positions of points (pixel observation points) on the imaginary object plane where lights coming from pixels of a solid-state imaging element and back-projected through the optical lenses are calculated (pixel observation point calculating step). The dispersion in position of the calculated pixel observation points is evaluated (evaluating step). Finally, a set of values of the variables giving maximum evaluated dispersion of the calculated pixel observation points is determined as optimum optical condition of the optical lenses (condition determining step). This reduces the number of pixels which image the same portions of the target object, making it possible to reduce portions of the same image information in multiple unit images, and to stably obtain a reconstructed image having a high definition.

9 Claims, 10 Drawing Sheets

OPTICAL CONDITION DESIGN METHOD FOR A COMPOUND-EYE IMAGING DEVICE

BACKGROUND OF THE INVENTION

1. Field of the Invention

The present invention relates to an optical condition design method for a compound-eye imaging device.

2. Description of the Related Art

A compound-eye imaging device is known which comprises an optical lens array having multiple micro optical lenses, and a solid-state imaging element (photodetector array) for imaging multiple unit images of a target object which are formed by the respective optical lenses of the optical lens array so as to reconstruct the multiple unit images into a high definition reconstructed image (refer to e.g. Japanese Laid-open Patent Publication 2001-61109). FIG. 8 is a schematic perspective view of such a conventional compound-eye imaging device 100.

As shown in FIG. 8, the compound-eye imaging device 100 has an optical lens array 101 having micro optical lenses L11, L12 . . . L33 equidistantly arranged in a matrix of rows and columns, and a solid-state imaging element 102 for imaging unit images K11, K12 . . . K33 based on images formed by the respective optical lenses L11, L12 . . . L33. The solid-state imaging element 102 has a major surface having many pixels g which are grouped into pixel groups G11, G12 . . . G33 in areas of the solid-state imaging element 102 corresponding to the respective optical lenses L11, L12 . . . L33. The pixel groups G11, G12 . . . G33 image or capture the corresponding unit images K11, K12 . . . K33, respectively, and convert the unit images K1, K12 . . . K33 to electric signals as image information, and further send the electric signals converted from the respective unit images K11, K12 . . . K33 to an image processor 103 which forms a reconstructed image from the electric signals of the unit images K11, K12 . . . K33.

Here, a mechanism to allow a compound-eye imaging device to form, from multiple unit images, a reconstructed image having a higher definition than that of each unit image will be explained with reference to FIG. 8. In the compound-eye imaging device 100, the optical lenses L11, L12 . . . L33 are distributed on the optical lens array 101 in a matrix of rows and columns, so that the respective unit images K11, K12 . . . K33 formed on the solid-state image element 102 are images which are viewed at angles slightly different from one another relative to a target object positioned in front of the compound-eye imaging device 100 (i.e. images with parallax). By using such unit images, as image information, which are thus slightly different from one another to have slightly different information, it is possible to form a reconstructed image based on the larger amount of information, making it possible for the reconstructed image to have a higher definition than that of each unit image. In other words, in order to obtain larger amount of information of unit images, it is desirable that the respective unit images do not have portions of the same image information.

However, when considering specific pixels g in the unit images K11, K12 . . . K33, different pixels g may in some cases have the same image information. More specifically, light emitted from the same portion on a target object may in some cases pass through different paths so as to be imaged by two different pixels g that are, for example, a pixel g in the pixel group G11 and a pixel g in the pixel group G12. This causes the two pixels g to have the same image information based on an image of the same portion on the target object. In other words, although the unit images K11 and K12 are those obtained by imaging or capturing the target object at different angles, the unit images K11 and K12 may in some cases have partially the same image information. In such cases, the difference of image information between the unit images K11 and K12 is reduced thereby so that the definition of the formed reconstructed image is reduced.

The case where different unit images have partially the same image information in the compound-eye imaging device 100 will be described in more detail with reference to FIGS. 9A and 9B. FIG. 9A is a schematic side view of the compound-eye imaging device 100, placed vertically, in a mode of collecting lights from a target object T by the optical lenses L11, L12 . . . L33, in which the target object T is positioned in front of the compound-eye imaging device 100. FIG. 9B is a schematic enlarged side view of a portion of FIG. 9A as indicated by the dashed circle 110. In FIG. 9B, the three optical lenses L11, L21 and L31 in the leftmost column in the compound-eye imaging device of FIG. 8 together with the three pixel groups G11, G21 and G31 are representatively shown, in which the solid-state imaging element 102 is assumed to have 8 (eight) pixels g1 to g8 for each of the optical lenses L11, L21 and L31.

Both FIG. 9A and FIG. 9B show paths of lights collected by the respective optical lenses L11, L21 and L31 to reach the respective pixels of the solid-state imaging element 102, in which such light paths for the optical lenses L11, L21 and L31 are shown by solid lines, coarse dashed lines and fine dashed lines in order from top to bottom. More specifically, in the case of the optical lens L11, for example, the uppermost light denoted by h1 passes through the optical lens L11, and is collected onto the lowermost pixel denoted by g8 in the pixel group G11. Similarly, the n-th light from the top which can be denoted by hn passes through the optical lens L11, and is collected onto the (9−n)th pixel from the top which can be denoted by g(9−n). The lowermost light denoted by h8 passes through the optical lens L11, and is collected onto the uppermost pixel denoted by g1.

Now, assuming that the target object T is positioned in front of, and at a predetermined distance, from the compound-eye imaging device 100, FIGS. 9A and 9B show the case where light from a point p1 on the target object T is collected by the optical lens L11 as light h2 and imaged by pixel g7 in the pixel group G11, and is at the same time collected by the optical lens L31 as light h1 and imaged by pixel g8 in the pixel group G31. Thus, the image information of the pixel g7 in the unit image K11 is the same as the image information of the pixel g8 in the unit image K31, both based on the point P1 on the target object T. This indicates that points or portions on the target object T where the paths of lights h1, h2, h3 . . . intersect, that are p1, p2, p3 . . . , are imaged as the same image information in the different pixel groups G11, G12 . . . G33. Thus, it is understood that in the conventional compound-eye imaging device 100 with the regularly arranged optical lenses L11, L12 . . . L33, the intersection points between lights h1, h2, h3 . . . are present and concentrated on a specific plane, because the paths of lights h1, h2, h3 . . . are parallel to each other. Accordingly, if the target object T is located closer to the specific plane, it causes the respective unit images K11, K12 . . . K33 to have more portions of the same image information. This reduces the differences of image information between the unit images K11, K12 . . . K33, thereby reducing the definition of the reconstructed image.

Based on the knowledge described above, the present inventors conceived randomly arranging the respective optical lenses L11, L12 . . . L33 to prevent the intersection points between the paths of lights h1, h2 . . . h8 to the respective optical lenses L11, L12 . . . L33 from concentrating on a specific plane. This can be more specifically described with reference to FIG. 10 which is a schematic plan view of the optical lens array 101 of the conventional compound-eye imaging device 100. As shown in FIG. 10, the random arrangement is done by arranging the respective optical lenses L11, L12 ... L33 at positions which are offset from the normal positions regularly arranged in a matrix of rows and columns. This makes it possible to prevent the paths of lights h1, h2 ... h8 to the respective optical lenses L11, L12 ... L33 from being parallel to each other as shown in FIG. 11, which is a schematic view showing how lights h from the target object T are collected in the conventional compound-eye imaging device 100 with the randomly arranged optical lenses L11, L12 ... L33, thereby preventing occurrence of a plane on which light intersection points are concentrated.

This makes it possible to reduce portions of the same image information of the respective unit images K11, K12 ... K33, thereby increasing the definition of the reconstructed image. However, depending on a random number used to determine the arrangement of the optical lenses, the random arrangement of optical lenses described above may incidentally cause the intersection points between the paths of lights h1, h2 ... h8 to the respective optical lenses L11, L12 ... L33 to be incidentally concentrated on a specific plane. In this case, it is not possible to increase the definition of the reconstructed image. In short, the random arrangement of optical lenses does not make it possible to always stably increase the definition of the reconstructed image.

SUMMARY OF THE INVENTION

An object of the present invention is to provide an optical condition design method for a compound-eye imaging device which makes it possible to reduce portions of the same image information in multiple unit images captured in the compound-eye imaging device, and to stably obtain a reconstructed image having a high definition.

According to the present invention, this object is achieved by an optical condition design method for a compound-eye imaging device comprising: multiple optical lenses for collecting lights from a target object at different angles, and a solid-state imaging element having multiple pixels for receiving lights collected by the optical lenses to image unit images. The optical condition design method is for designing optical conditions of the optical lenses, and comprises: a plane setting step for setting at least one imaginary object plane in front of the optical lenses; a pixel observation point calculating step for changing a part of optical conditions of the optical lenses as variables and calculating positions of points (hereafter referred to as pixel observation points) on the at least one imaginary object plane where lights coming from the pixels of the solid-state imaging element and back-projected through the optical lenses intersect the at least one imaginary object plane when the part of the optical conditions is changed as the variables; an evaluating step for evaluating dispersion in position of the pixel observation points on the at least one imaginary object plane which are calculated in the pixel observation point calculating step; and a condition determining step for determining, as an optimum optical condition of the optical lenses, a set of values of the variables giving a maximum dispersion of the calculated pixel observation points which is evaluated in the evaluating step.

The optical condition design method for a compound-eye imaging device according to the present invention determines the optical condition of the optical lenses to achieve a large dispersion of the pixel observation points on the at least one imaginary object planes. This makes it possible to stably reduce the number of pixels which image the same portions of the target object, making it possible to reduce portions of the same image information in the multiple unit images, and obtain a reconstructed image having a high definition.

Preferably, the at least one imaginary object plane set in the plane setting step is multiple imaginary object planes at different distances from the optical lenses, and the optimum optical condition determined in the condition determining step is a set of variables giving a maximum total dispersion in all the multiple imaginary object planes. This preferred mode of the present invention makes it possible to determine the optimum optical condition based on the dispersion of the pixel observation points on multiple imaginary object planes, so that it is possible to more surely reduce the number of pixels which image the same portions of the target object.

Further preferably, the multiple imaginary object planes set in the plane setting step include a plane at an essentially infinite distance from the optical lenses, and a plane at a distance D from the optical lenses which satisfies the following equation:

$$D = Ld \cdot B / Gd \cdot k$$

where Ld is average distance between the solid-state imaging element and the optical lenses, B is average distance between adjacent optical lenses, Gd is average distance between adjacent pixels, and k is an integer of at least one. This makes it possible to evaluate the dispersion of the pixel observation points on the imaginary object planes where localizations of the pixel observation points are likely to occur. Thus, it is possible to more efficiently reduce the number of pixels which image the same portions of the target object.

Further preferably, the evaluating step calculates sum area of the unit surfaces containing at least one pixel observation point, and calculates ratio of the sum area to total area of the at least one imaginary object plane, and evaluates the dispersion of the pixel observation points by using the ratio of the sum area to the total area of the at least one imaginary object plane. This makes it possible to more efficiently evaluate the dispersion of the pixel observation points.

Still further preferably, the evaluating step calculates the number of pixel observation points of each unit surface as a local density of the each unit surface, and evaluates the dispersion of the pixel observation points using variance of the local densities of the unit surfaces. This makes it possible to more accurately evaluate the dispersion of the pixel observation points.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein:

FIG. 7A is a schematic view showing an original image, FIG. 7B is a schematic view showing a reconstructed image according to one of the two conventional compound-eye imaging devices, and FIG. 7C is a schematic view showing a reconstructed image according to the other of the two conventional compound-eye imaging devices, while FIG. 7D is a schematic view showing a reconstructed image according to the compound-eye imaging device using the optical condition design method of the present invention;

FIG. 9A is a schematic side view of the conventional compound-eye imaging device in a mode of collecting lights from a target object, while

DESCRIPTION OF THE PREFERRED EMBODIMENTS

Figure 1:
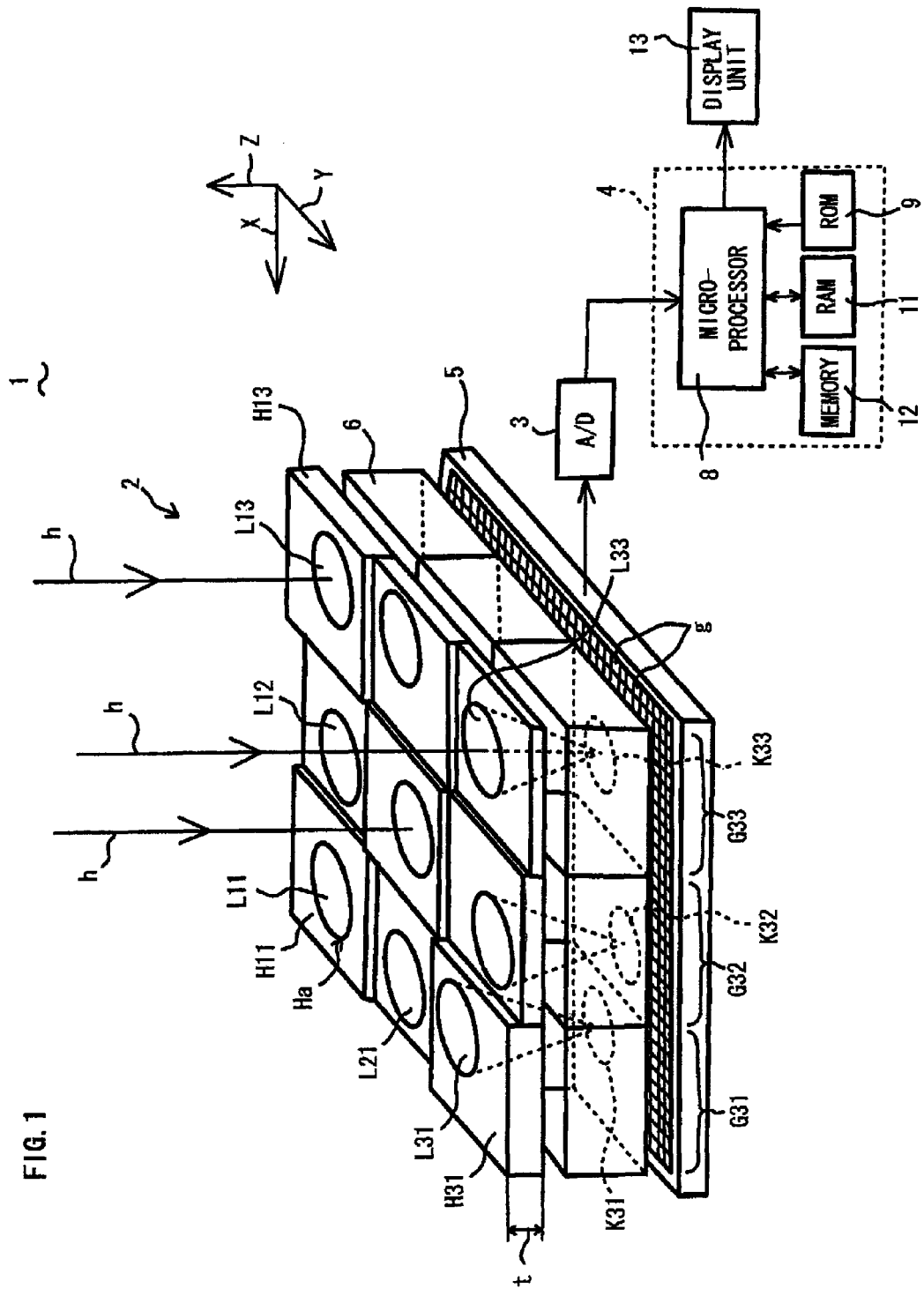
FIG. 1 is a schematic perspective view, with a block diagram, of a compound-eye imaging device formed based on optical conditions determined by the optical condition design method according to a first embodiment of the present invention.

Embodiments of the present invention, as best mode for carrying out the invention, will be described hereinafter with reference to the drawings. The present invention relates to an optical condition design method for a compound-eye imaging device. It is to be understood that the embodiments herein are not intended as limiting, or encompassing the entire scope of, the invention. Note that like parts are designated by like reference numerals or characters throughout the drawings.

First Embodiment

An optical condition design method for a compound-eye imaging device 1 according to a first embodiment of the present invention will be described with reference to FIG. 1 to FIG. 3. FIG. 1 is a schematic perspective view, with a block diagram, of the compound-eye imaging device 1 formed based on optical conditions determined by the optical condition design method according to the first embodiment. As shown in FIG. 1, the compound-eye imaging device 1 comprises an imaging device body 2 for collecting lights h from a target object and forming an image therefrom, and an image processing unit 4 connected to the imaging device body 2 via an AD (Analog-to-Digital) converter 3 for forming a reconstructed image from image information (multiple unit images) output from the imaging device body 2.

The imaging device body 2 comprises: 9 (nine) optical lenses L11, L12 ... L33 for collecting lights h from the target object at different angles, respectively; holders H11, H12 ... H33 for holding the respective optical lenses L1, L12 ... L33; a solid-state imaging element (photodetector array) 5 having multiple pixels g for receiving lights h collected by the respective optical lenses L11, L12 ... L33 to image unit images K11, K12 ... K33; and a partition wall 6 placed between the solid-stating imaging element 5 and the optical lenses L11, L12 ... L33. The pixels g of the solid-state imaging element 5 are arranged to be divided into 9 (nine) areas as pixel groups G11, G12 ... G33. The pixels g of the respective pixel groups G11, G12 ... G33 capture or image the respective unit images K11, K12 ... K33. The partition wall 6 limits lights h propagating from the optical lenses L1, L12 ... L33 to the solid-state imaging element 5 so as to prevent such lights h from entering pixel groups other than those in the areas corresponding to the lights h, respectively.

The holders H11, H12 ... H33 are designed to be able to hold the corresponding optical lenses L11, L1 ... L33 each at an arbitrary or desired position thereon, such that the respective optical lenses L11, L12 ... L33 are held by the holders H11, H12 ... H33 at three-dimensional positions determined by an optical condition design method described later, respectively. More specifically, each of the holders H11, H12 ... H33 allows a recess Ha for holding each corresponding optical lens to be formed at an arbitrary horizontal (two-dimensional) position on an upper surface of the each holder, and can be designed to have an arbitrary thickness t so as to be positioned at an arbitrary vertical position. The holders H11, H12 ... H33 are integrally assembled with facing side surfaces of adjacent ones thereof being bonded using a bonding material such as an adhesive.

The image processing unit 4 will now be described. The image processing unit 4 in the compound-eye imaging device 1 comprises a microprocessor 8, a ROM (Read Only Memory) 9 storing an operation program of the microprocessor 8, a RAM (Random Access Memory) 11 for temporarily storing e.g. image data, and a large capacity memory 12. Based on the image information of 9 unit images K11, K12 ... K33 sent from the solid-state imaging element 5, the microprocessor 8 forms a reconstructed image, and displays it on a display unit 13 such as a liquid crystal panel. A known process similar to that described in Japanese Laid-open Patent Publication 2001-61109 can be used as the process performed by the microprocessor 8 to form a reconstructed image from the multiple unit images K11, K12 ... K33. For example, the microprocessor 8 can: first receive, as digital image information, the 9 unit images K11, K12 ... K33 imaged by the solid-state imaging element 5; calculate distances for respective pixels based on the respective unit images to create a distance image; and rearrange the unit images K11, K12 ... K33 for the respective pixels based on the created or calculated distance image so as to form a reconstructed image.

Figure 2:
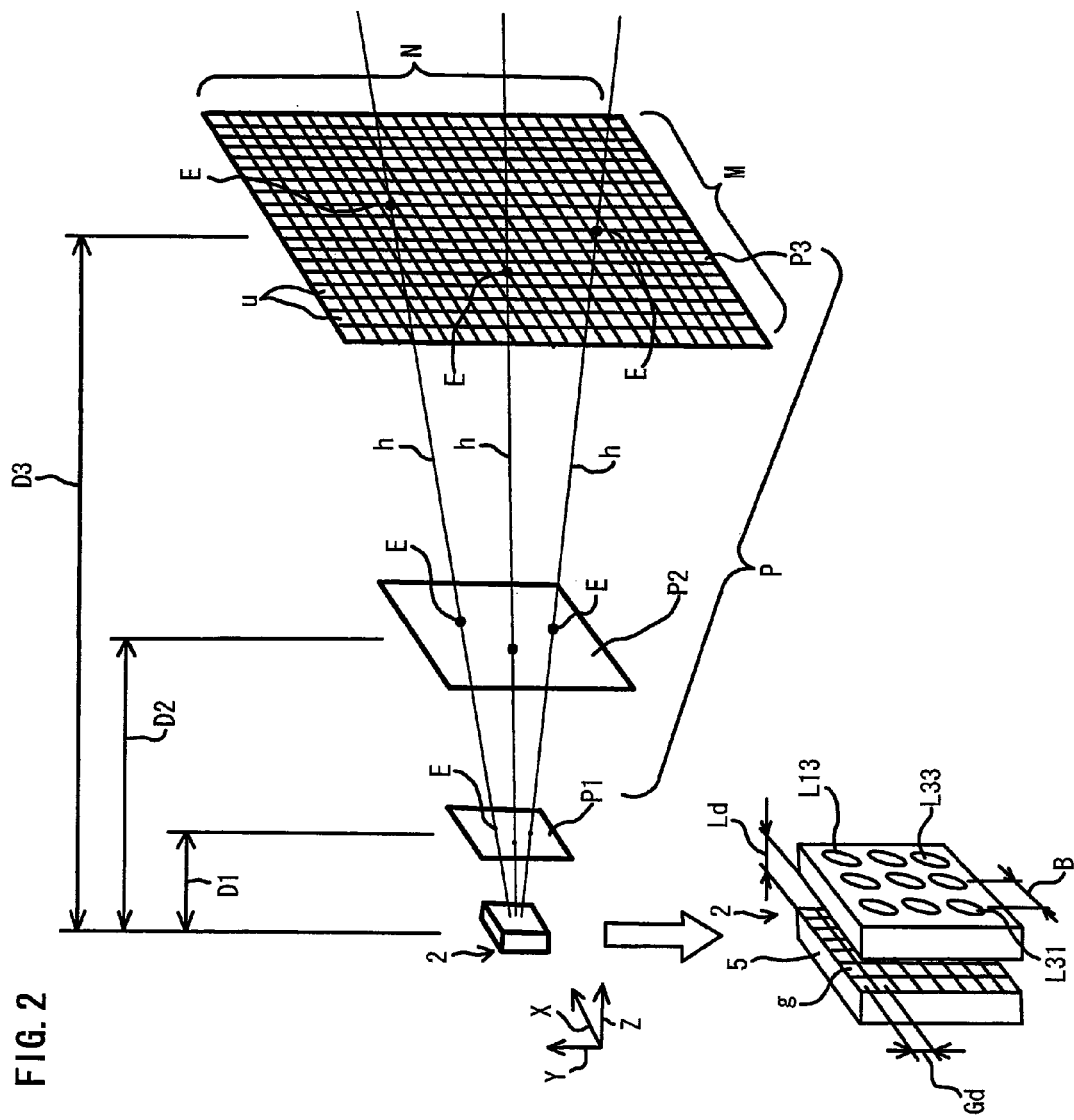
FIG. 2 is a schematic view showing an overall concept of the optical condition design method.
Figure 3:
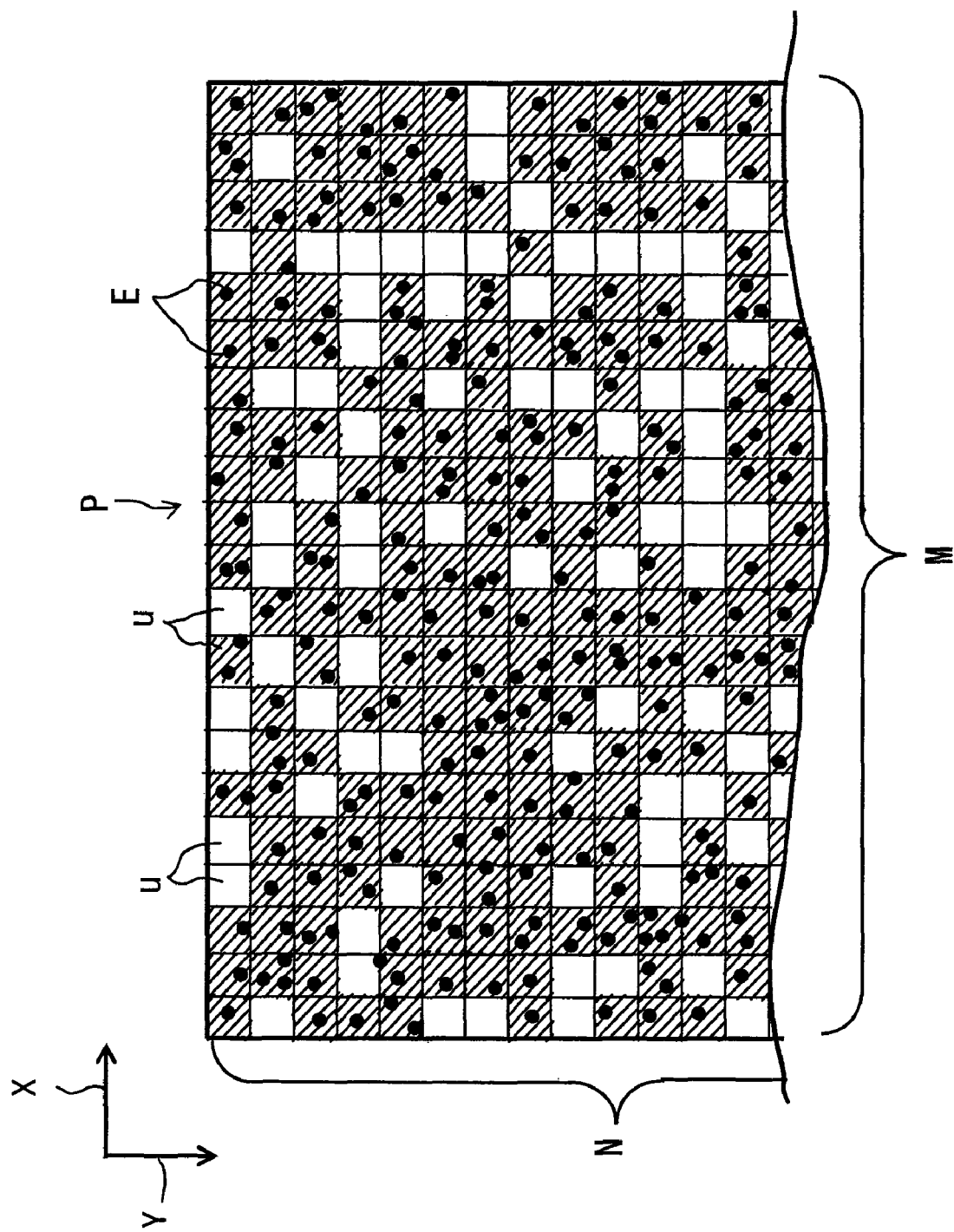
FIG. 3 is a schematic enlarged view showing an imaginary object plane used in the optical condition design method.

Referring now to FIG. 2 and FIG. 3, an optical condition design method according to the present embodiment will be described. FIG. 2 is a schematic view showing an overall concept of the optical condition design method, while FIG. 3 is a schematic enlarged view showing an imaginary object (target object) plane used in the optical condition design method. Note that in FIG. 2, the imaging device body 2 is shown in an enlarged view as well. The optical condition design method of the present embodiment comprises: a plane setting step for setting at least one imaginary object plane P in front of the imaging device body 2 (i.e. in front of the optical lenses L11, L12 ... L33); and a pixel observation point calculating step for changing a part of optical conditions of the optical lenses L11, L12 ... L33 as variables and calculating positions of points (hereafter referred to as pixel observation points) E on the at least one imaginary object plane P where lights (hereafter referred to as back projection lights) h coming from the pixels g of the solid-state imaging element 5 and back-projected through the respective optical lenses L11, L12 ... L33 intersect the at least one imaginary object plane P when the part of the optical conditions is changed as the variables.

The optical condition design method of the present embodiment further comprises: an evaluating step for evaluating dispersion in position of the calculated pixel observation points E on the at least one imaginary object plane P; and a condition determining step for determining, as an optimum optical condition of the optical lenses L1, L12 ... L33, values of the variables giving a maximum evaluated dispersion of the calculated pixel observation points E. Each of these steps is performed by the microprocessor 8 in cooperation with other relevant elements and units in the compound-eye imaging device 1 described above. Each of the steps will be described in detail below.

First, the plane setting step sets imaginary object planes P1, P2, P3 ... at multiple distances (different distances) D (which can be nearby distances) from the imaging device body 2 (i.e. from the optical lenses L11, L12 ... L33) where the distances D satisfy the following equation (1), and at an essentially infinite distance (D=∞ or sufficiently distant) from the imaging device body 2 (i.e. from the optical lenses L11, L12 ... L33):

$$D = Ld \cdot B / Gd \cdot k \quad (1)$$

In equation (1), Ld is average distance between the solid-state imaging element 5 and the optical lenses L11, L12 ... L33, B is average distance between adjacent optical lenses, Gd is average distance between adjacent pixels g, and k is an integer of at least one. Each value of Ld, B and Gd in the equation (1) is given in advance when making the basic design of the imaging device body 2. Equation (1) indicates that the distance D can be set to have multiple values by setting the integer k to have multiple values. FIG. 2 shows three imaginary object planes P1, P2 and P3 as representative examples set at different distances D1, D2 and D3 from the imaging device body 2 distance (i.e. from the optical lenses L11, L12 ... L33) (D=sufficiently distant), respectively, which are set by using three values of the integer k.

The distance D satisfying the equation (1) corresponds to the position of a plane where many intersection points between the paths of lights h collected by the optical lenses L11, L12 ... L33 occur, assuming that the optical lenses L11, L12 ... L33 are equidistantly arranged in a matrix of rows and columns as in the conventional compound-eye imaging device. The plane where many intersection points between the paths of lights h occur means a plane where localizations of the pixel observation points E are likely to occur. Thus, when an imaginary object plane P is set at distance D, a change in the amount (value) of each variable causes a larger change in the dispersion (from localization to distribution) of the pixel observation points E than at other distances, so that the evaluation of dispersion of the pixel observation points E in the evaluating step can be made more effectively, consequently making it possible to more efficiently reduce the number of pixels g which image the same portions of the target object.

Next, the pixel observation point calculating step changes a part of optical conditions of the optical lenses L11, L12 ... L33 as variables, and performs pixel observation point calculation as described below. Here, three-dimensional positions of the respective optical lenses are taken as an example of a part of such optical conditions. The pixel observation point calculating step uses the three-dimensional positions of the optical lens L11, L12 ... L33 as variables, and sets a first set of three-dimensional positions of the optical lenses L11, L12 ... L33, and calculates positions of the pixel observation points E on the imaginary object planes P where the back projection lights h from the pixels g of the solid-state imaging element 5 intersect the imaginary object planes at the first set of three-dimensional positions of the optical lenses L11, L12 ... L33. Note that in FIG. 2, only three back projection lights h are shown representatively.

Similarly, the pixel observation point calculating step sets a second set of three-dimensional positions of the optical lenses L11, L12 ... L33, and calculates positions of the pixel observation points E on the imaginary object planes P at the second set of three-dimensional positions of the optical lenses L11, L12 ... L33. In this way, the pixel observation point calculating step successively changes the sets of three-dimensional positions of the optical lenses L11, L12 ... L33, and performs calculation of positions of the pixel observation points E on the imaginary object planes P at each of the first, second and successive sets of three-dimensional positions of the optical lenses L11, L12 ... L33.

The way of changing the sets of three-dimensional positions of the optical lenses L11, L12 ... L33 will be described in detail below. First, the three-dimensional positions of the optical lenses L11, L12 ... L33 are set as coordinate system variables (x11, y11, z11), (x12, y12, z12) ... (x33, y33, z33), and each of the variables is changed one by one. For example, the X coordinate x11, as a variable, of the optical lens L11 is changed by a small amount dx between successive sets of three-dimensional positions of the optical lenses L11, L12 ... L33 without changing the other variables. Next, in a similar manner, the Y coordinate y11, as a variable, of the optical lens L11 is changed by a small amount dy between successive sets of three-dimensional positions of the optical lenses L11, L12 ... L33 without changing the other variables. In this way, the sets of three-dimensional positions of the optical lenses L11, L12 ... L33 are changed successively.

Note that the number of such successive changes should be practically sufficient to obtain a significant value of maximum dispersion in position of the calculated pixel observation points E described later, and that the way of changing each variable by a small amount each time to allow sufficient number of successive changes of the variable described above can be efficiently performed by using the well-known downhill simplex method. Further note that here it is assumed in the present embodiment that the sets of three-dimensional positions of the optical lenses L11, L12 ... L33 are changed without changing the other optical conditions such as focal length, lens distortion and so on which are given in advance as constants, although it is also possible to change the constants to variables. By changing each of the variables in the manner described above each time, the corresponding path of back projection light h changes by a small amount each time, so that the position of the pixel observation point E on each imaginary object plane P changes by a small amount each time. Each time each of the variables is changed, the pixel observation point calculating step calculates an XY coordinate of each pixel observation point E on each imaginary object plane P.

Next, the evaluating step evaluates dispersion in position of the pixel observation points E on each imaginary object plane P which are obtained by calculation in the pixel observation point calculating step. In the present embodiment, the dispersion is evaluated as follows. First, the entire surface of each imaginary object plane P is assumed to be composed of a number of unit surfaces u, some of which contain the pixel observation points E, and the others do not. (FIG. 3 shows that the imaginary object plane P is composed of M×N cells of unit surface u). The ratio of unit surfaces u containing pixel observation points E to the entire surface (i.e. all unit surfaces u of M×N cells) of each imaginary object plane P is defined as a coverage ratio.

The evaluation step determines that the dispersion is large if the coverage ratio is high. Note that each of the unit surfaces u is rectangular surface each with a small area having sides parallel to the X and Y axes of the XY coordinate. More specifically, when a number of pixel observation points E are dispersedly present on the imaginary object plane P as shown in FIG. 3, the evaluating step calculates the sum area of the unit surfaces u containing at least one pixel observation point E, and calculates the ratio of the sum area to the total area (entire surface area) of the imaginary object plane P. In FIG. 3, the unit surfaces u containing at least one pixel observation point E are hatched.

Here assuming that the coordinate (cell position) of each unit surface u on one imaginary object plane P is U(X,Y), and defining a sign function S(x,y) which has a value of "1" (one) and a value of "0" (zero), respectively, when a pixel observation point E is present and absent (not present), respectively, at the position of coordinate (x,y) on the imaginary object plane P, then the number Ea of pixel observation points E in each unit surface u at the coordinate (cell position) U(X,Y) is expressed by the following equation (2):

$$Ea = \iint_{U(X,Y)} S(x, y) dx dy \quad (2)$$

Now defining a sign function Step (Ea) which has a value of "0" (zero) and a value of "1" (one), respectively, when the pixel observation points Ea is negative including zero and is positive, respectively, then the sum W of the areas of the unit surfaces u containing at least one pixel observation point E is expressed by the following equation (3):

$$W = \sum_{X=0}^{M-1} \sum_{Y=0}^{N-1} \text{Step}(Ea) \quad (3)$$

In the equation (3), M is the number of unit surfaces u in the X direction, while N is the number of unit surfaces u in the Y direction. Here, M·N corresponds to the area of the imaginary object plane P, so that the coverage ratio Ra in one imaginary object plane P is expressed by the following equation (4):

$$Ra = W/M \cdot N \quad (4)$$

Expanding equation (4) to all imaginary object planes P1, P2, P3 ... for the total coverage ratio R of all the imaginary object planes P1, P2, P3 ..., the total coverage ratio R is expressed by the following equation (5):

$$R = \sum_{I=0}^{La-1} \sum_{X=0}^{M-1} \sum_{Y=0}^{N-1} \text{Step}\left\{ \iint_{U(X,Y,Z(I))} S(x, y, Z(I)) dx dy \right\} / La \cdot M \cdot N \quad (5)$$

In the equation (5), La is the number of set imaginary object planes P, and Z(I) is distance of I-th imaginary object plane P from the imaging device body 2 (i.e. from the optical lenses L11, L12 ... L33).

Finally, the condition determining step determines that values of the variables giving a maximum total coverage ratio R as evaluated in the evaluating step give an optimum optical condition of the optical lenses L1, L12 ... L33. Thus, a set of specific values of the three-dimensional positions (x11, y11, z11), (x12, y12, z12) ... (x33, y33, z33) of the respective optical lenses L11, L12 ... L33 is determined by the condition determining step as an optimum optical condition of the optical lenses L11, L12 ... L33. In other words, the optimum optical condition of the optical lenses L11, L12 ... L33 is a set of specific values of the variables giving a maximum total dispersion in all the imaginary object planes P. Note that the maximum total coverage ratio R is obtained by making practically sufficient number of changes in the amount (value) of each variable as described above with respect to obtaining a significant value of maximum dispersion in position of the calculated pixel observation points E. Further note that when the total coverage ratio R is maximum, the coverage ratios Ra in some of the imaginary object planes P may be even higher than the maximum value, although the coverage ratios Ra in other imaginary object planes P may be lower than the maximum value.

According to the present embodiment, the evaluating step described above makes it possible to advantageously and efficiently evaluate the dispersion of the pixel observation points E, because it evaluates the dispersion of the pixel observation points E by using the ratio of the sum area of the unit surfaces u having at least one pixel observation point E to the total area of the imaginary object planes P. Note that although the pixel observation point calculating step described above uses the three-dimensional positions of the optical lenses L11, L12 ... L33 as variables, another optical condition can be used as variables. For example, the focal lengths of the optical lenses L11, L12 ... L33 can be used as variables by treating the three-dimensional positions as constants. Further note that although the present embodiment described above uses multiple imaginary object planes P, the concept of the present invention allows using a single imaginary object plane such as P3 without using the other imaginary object planes P as long as the pixel observation point calculating step, the evaluating step and the condition determining step are performed similarly as above.

Second Embodiment

Figure 4:
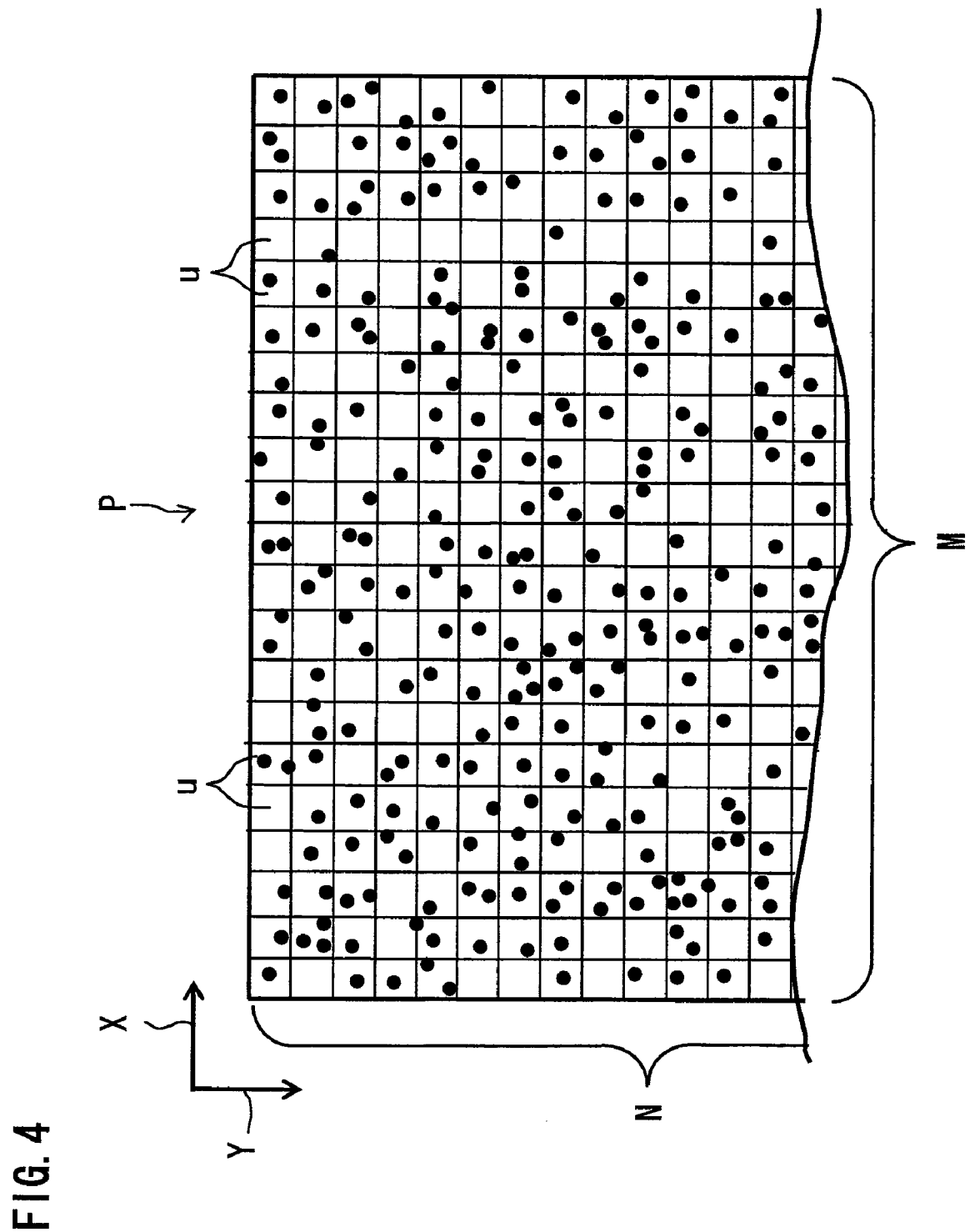
FIG. 4 is a schematic enlarged view showing an imaginary object plane used in a second embodiment of the present invention.

Referring to FIG. 4, an optical condition design method according to a second embodiment of the present invention will be described. FIG. 4 is a schematic enlarged view showing an imaginary object (target object) plane used in the present embodiment. The present embodiment is basically the same as the first embodiment except for the evaluating step and the condition determining step. In the first embodiment, the ratio of the unit surfaces u having at least one pixel observation point E is calculated using the coverage ratio R so as to determine that a higher coverage ratio R corresponds to a larger dispersion of the pixel observation points E. On the other hand, in the evaluating step of the present embodiment, the number of pixel observation points E of each unit surface u is calculated as a local density of the each unit surface u, and the variance (meaning the same as variance in the statistics) of the local densities of the unit surfaces u is evaluated as a dispersion of the pixel observation points E so as to determine that a smaller variance corresponds to a larger dispersion of the pixel observation points E.

More specifically, each of the unit surfaces u forming each imaginary object plane P has a local density $\rho(X,Y)$ corresponding to the number of pixel observation points E therein.

The evaluation step calculates the local density of each unit surface u, and then calculates the variance V of the local densities ρ on the imaginary object plane P. Assuming that the coordinate (cell position) of each of the unit surfaces u on one imaginary object plane P is U(X,Y), the number Ea of the pixel observation points E present in the each unit surface u at coordinate U(X,Y) is expressed by the above equation (2) similarly as in the first embodiment, so that the local density ρ(X,Y) is expressed by the following equation (6):

$$\rho(X, Y) = \int\int_{U(X,Y)} S(x, y) dx dy \Big/ \int\int_{U(X,Y)} dx dy \quad (6)$$

The average value Ev of the local densities ρ, each expressed by equation (6), is expressed by the following equation (7):

$$Ev = \sum_{X=0}^{M-1} \sum_{Y=0}^{N-1} \rho(X, Y) / M \cdot N \quad (7)$$

Thus, the variance Va in one imaginary object plane P is expressed by the following equation (8):

$$Va = \sum_{X=0}^{M-1} \sum_{Y=0}^{N-1} \{\rho(X, Y) - Ev\}^2 / M \cdot N \quad (8)$$

Expanding the equation (8) to all imaginary object planes P1, P2, P3 ... for the total variance similarly as in the first embodiment, the total variance V is expressed by the following equation (9):

$$V = \sum_{I=0}^{La-1} \sum_{X=0}^{M-1} \sum_{Y=0}^{N-1} \{\rho(X, Y, Z(I)) - Ew\}^2 / La \cdot M \cdot N \quad (9)$$

Here, Ew is the average of the local densities ρ based on equation (7) and having the Z axis component added thereto, and is expressed by the following equation (10):

$$Ew = \sum_{I=0}^{La-1} \sum_{X=0}^{M-1} \sum_{Y=0}^{N-1} \rho(X, Y, Z(I)) / La \cdot M \cdot N \quad (10)$$

Finally, the condition determining step determines that a set of values of the variables giving a minimum variance V as evaluated in the evaluating step is an optimum optical condition of the optical lenses L11, L12 ... L33. Thus, a set of specific values of the three-dimensional positions (x11, y11, z11), (x12, y12, z12) ... (x33, y33, z33) of the respective optical lenses L11, L12 ... L33 is determined by the condition determining step as an optimum optical condition of the optical lenses L11, L12 ... L33. In other words, the optimum optical condition of the optical lenses L11, L12 ... L33 is a set of specific values of the variables giving a maximum total dispersion in all the imaginary object planes P. According to the present embodiment, the evaluating step described above makes it possible to advantageously and accurately evaluate the dispersion of the pixel observation points E, because it evaluates the dispersion of the pixel observation points E by using the local densities of the pixel observation points E in the respective unit surfaces u which correspond to the number of pixel observation points E therein. Note that similarly as in the first embodiment, an optical condition other than the three-dimensional positions of the optical lenses can also be used, and a single imaginary object plane can also be used instead of the multiple imaginary object planes.

As described in the foregoing, the optical condition design method for a compound-eye imaging device according to each of the first and second embodiments of the present invention allows the compound-eye imaging device 1 to have a large dispersion of the pixel observation points E on the imaginary object planes P, thereby reducing the occurrence of planes where many intersection points between the lights h collected by the optical lenses L11, L12 ... L33 are present. This reduces the number of pixels g (in the pixel groups G11, G12 ... G33) which image the same portions of the target object, making it possible to reduce portions of the same image information in the multiple unit images K11, K12 ... K33, and to stably obtain a reconstructed image having a high definition.

EXAMPLE

An example of the present invention and comparative examples were prepared and compared as follows. The three-dimensional position of the optical lenses L11, L12 ... L33 were set as variables, and the downhill simplex method was used as an algorithm to change each variable each time to allow sufficient number of successive changes of the variables so as to obtain values of the variables giving a maximum total coverage ratio R (optimum optical condition). Four imaginary object planes P were set at distances of 0.2 m (meter), 0.4 m, 5 m and 10 m, respectively, from the compound-eye imaging device 1. The number of unit surfaces u on each of the imaginary object planes P was set to be the same as the number of the pixels g of the solid-state imaging element 5. More specifically, the numbers M and N of unit surfaces u in the X and Y directions of each imaginary object plane P were set to be the same as the numbers of pixels g in the X and Y directions of the solid-state imaging element 5, respectively. For comparison, a conventional compound-eye imaging device (hereafter referred to as conventional device 1) with regularly equidistantly arranged optical lenses L11, L12 ... L33 was prepared, and further a conventional compound-eye imaging device (hereafter referred to as conventional device 2) with randomly arranged optical lenses L11, L12 ... L33 was prepared.

Table 1 below shows the coverage ratio Ra in each of the imaginary object planes P giving the maximum total coverage ratio R under the settings described above with respect to the compound-eye imaging device 1 according to the present example (present invention) as well as the conventional devices 1 and 2 for comparison.

TABLE 1

| | Coverage Ratio Ra | | | |
|---|---|---|---|---|
| Distance (m) | 0.2 | 0.4 | 5.0 | 10.0 |
| Present invention | 79% | 76% | 86% | 85% |
| Conventional Device 1 | 11% | 100% | 15% | 13% |
| Conventional Device 2 | 66% | 72% | 66% | 66% |

In the conventional device 1, the coverage ratio Ra is 100% in the imaginary object plane at the distance of 0.4 m, but the coverage ratios Ra are low in the other imaginary object planes. On the other hand, in the conventional device 2, the coverage ratio Ra is almost unchanged between 66% and 72%. In contrast, in the compound-eye imaging device 1 of the present example present invention), the obtained coverage ratio Ra is in the high 70% range in the imaginary object planes closer to the compound-eye imaging device 1, while the obtained coverage ratio Ra is in the 80% range in the imaginary object planes farther from the compound-eye imaging device 1.

Figure 5:
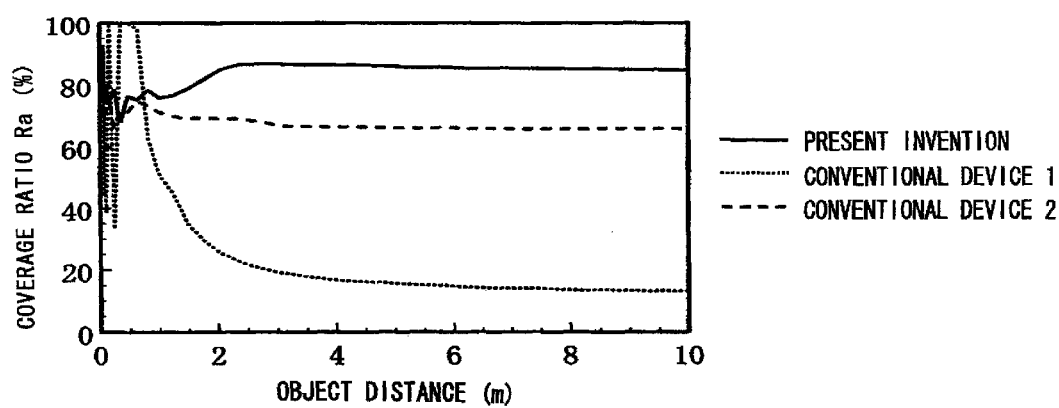
FIG. 5 is a graph showing changes in coverage ratio as calculated using simulation according to the compound-eye imaging device using the optical condition design method of the present invention as well as two kinds of conventional compound-eye imaging devices.
Figure 6:
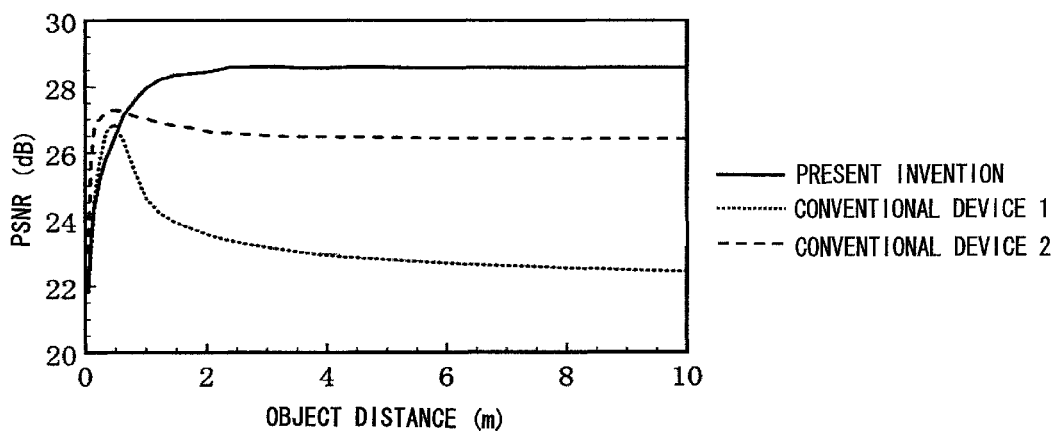
FIG. 6 is a graph showing changes in PSNR of formed reconstructed images according to the compound-eye imaging device using the optical condition design method of the present invention as well as the two conventional compound-eye imaging devices.

Under the same conditions, changes in the coverage ratio Ra with a change in the distance D of the imaginary object plane from the compound-eye imaging device were calculated using simulation with respect to the compound-eye imaging device 1 of the present example (present invention) as well as the conventional devices 1 and 2. The results of the calculation are shown in FIG. 5. In addition, under the same conditions, changes in PSNR (Peak Signal to Noise Ratio) of formed reconstructed images with a change in the distance D of the imaginary object plane from the compound-eye imaging device were also calculated using simulation with respect to the compound-eye imaging device 1 of the present example as well as the conventional devices 1 and 2. The results of the calculations are shown in FIG. 6. Note that PSNR represents clarity of definition of each reconstructed image compared with the corresponding original image of the target object. It is apparent from FIG. 6 that the PSNR values according to the present example are improved over those according to the conventional devices 1 and 2 by about 6 dB and 3 dB, respectively.

Figure 7:
Figure 8:
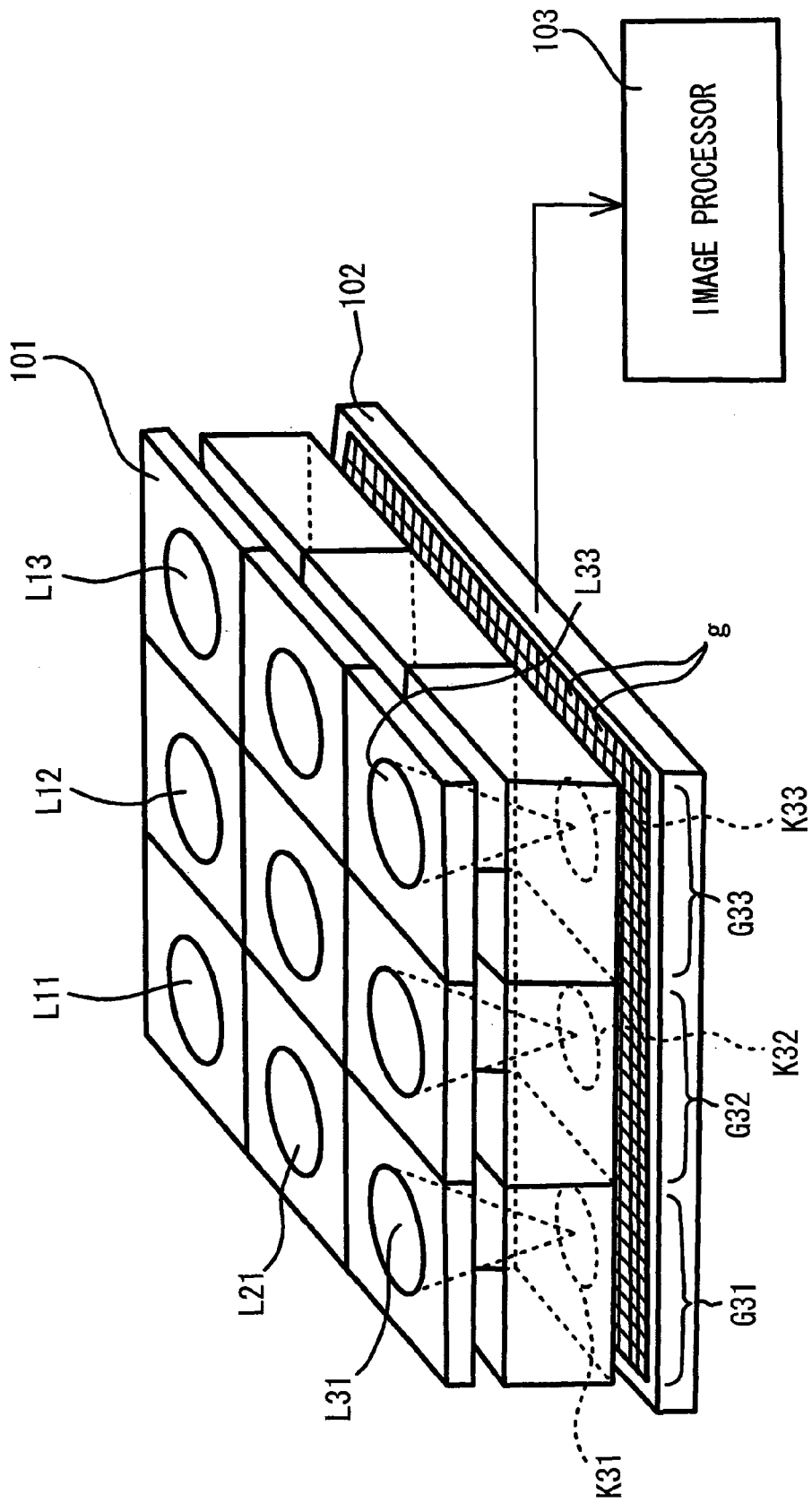
FIG. 8 is a schematic perspective view of a conventional compound-eye imaging device.
Figure 9B:
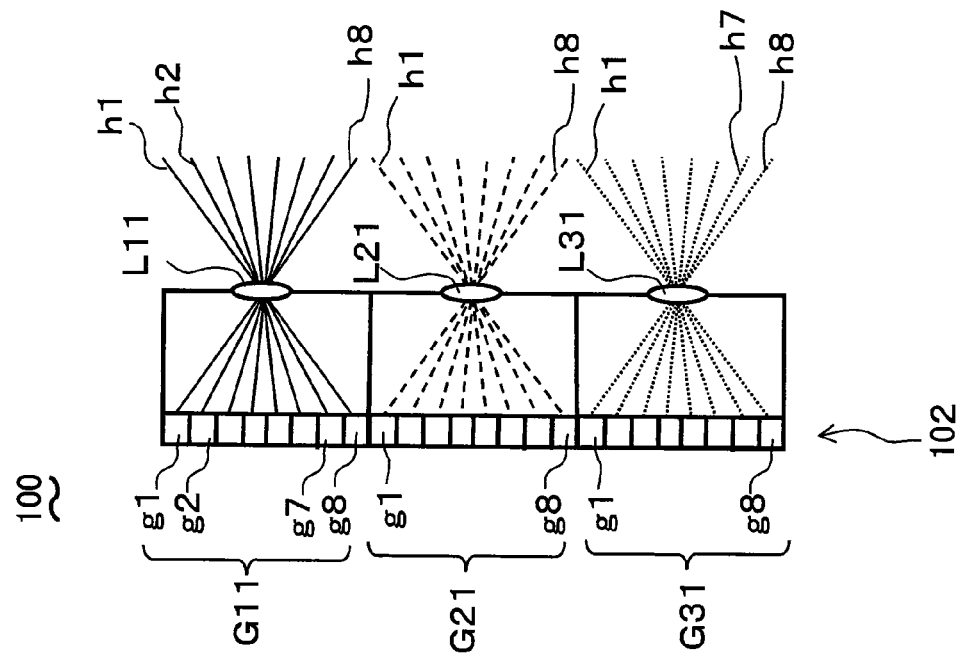
FIG. 9B is a schematic enlarged side view of a portion of FIG. 9A as indicated by the dashed circle 110.
Figure 9A:
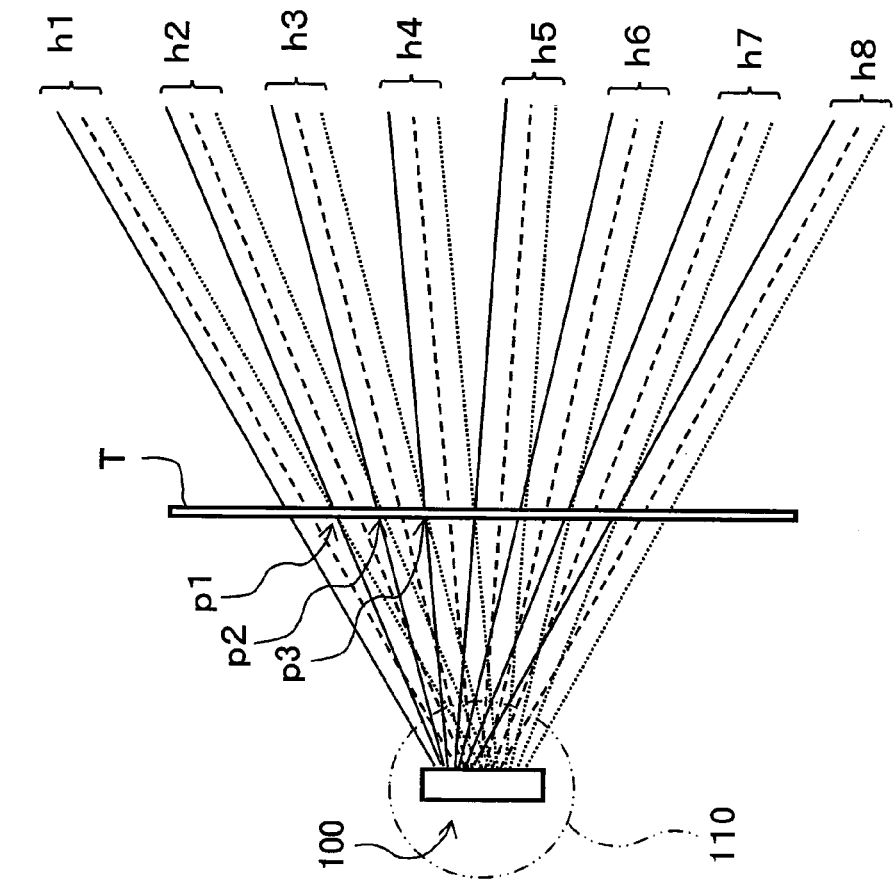
Figure 10:
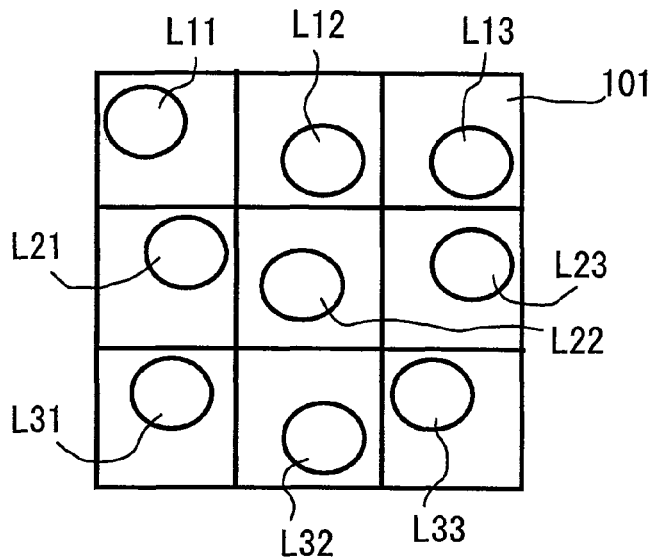
FIG. 10 is a schematic plan view of an optical lens array of the conventional compound-eye imaging device with randomly arranged optical lenses.
Figure 11:
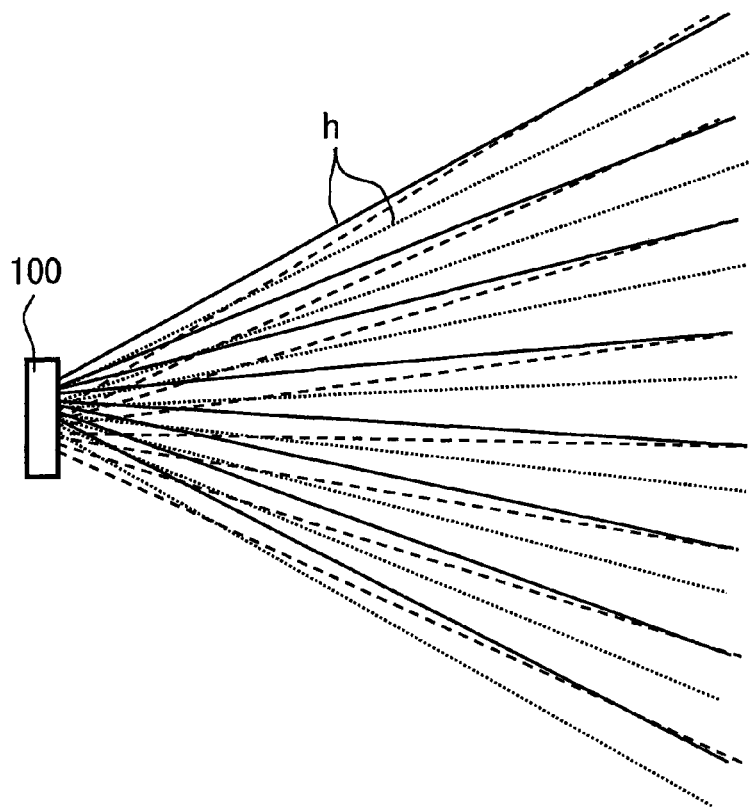
FIG. 11 is a schematic view showing how lights from the target object are collected in the conventional compound-eye imaging device with the randomly arranged optical lenses.

Finally, FIG. 7A shows an original image used to evaluate the optical condition design method for the compound-eye imaging device 1 according to the present example (present invention) and those for the conventional devices 1 and 2. FIG. 7D shows a reconstructed image formed by the compound-eye imaging device 1 of the present example, while FIG. 7B and FIG. 7C show reconstructed images formed by the conventional devices 1 and 2, respectively, for comparison. The PSNR value of the image according to the present example was 28.6 dB, while the PSNR values of the images according to the conventional devices 1 and 2 were 22.8 dB and 26.4 dB, respectively.

The present invention has been described above using presently preferred embodiments, but such description should not be interpreted as limiting the present invention. Various modifications will become obvious, evident or apparent to those ordinarily skilled in the art, who have read the description. Accordingly, the appended claims should be interpreted to cover all modifications and alterations which fall within the spirit and scope of the present invention.

This application is based on Japanese patent application 2008-223979 filed Sep. 1, 2008, the content of which is hereby incorporated by reference.

What is claimed is:

1. An optical condition design method for a compound-eye imaging device comprising: multiple optical lenses for collecting lights from a target object at different angles, and a solid-state imaging element having multiple pixels for receiving lights collected by the optical lenses to image unit images, the optical condition design method being for designing optical conditions of the optical lenses, and comprising:

a plane setting step for setting at least one imaginary object plane in front of the optical lenses;

a pixel observation point calculating step for changing a part of optical conditions of the optical lenses as variables and calculating positions of points (hereafter referred to as pixel observation points) on the at least one imaginary object plane where lights coming from the pixels of the solid-state imaging element and back-projected through the optical lenses intersect the at least one imaginary object plane when the part of the optical conditions is changed as the variables;

an evaluating step for evaluating dispersion in position of the pixel observation points on the at least one imaginary object plane which are calculated in the pixel observation point calculating step; and a condition determining step for determining, as an optimum optical condition of the optical lenses, a set of values of the variables giving a maximum dispersion of the calculated pixel observation points which is evaluated in the evaluating step.

2. The optical condition design method for a compound-eye imaging device according to claim 1, wherein the at least one imaginary object plane set in the plane setting step is multiple imaginary object planes at different distances from the optical lenses, and wherein the optimum optical condition determined in the condition determining step is a set of variables giving a maximum total dispersion in all the multiple imaginary object planes.

3. The optical condition design method for a compound-eye imaging device according to claim 2, wherein the multiple imaginary object planes set in the plane setting step include a plane at an essentially infinite distance from the optical lenses, and a plane at a distance D from the optical lenses which satisfies the following equation:

$$D = Ld \cdot B / Gd \cdot k$$

where Ld is average distance between the solid-state imaging element and the optical lenses, B is average distance between adjacent optical lenses, Gd is average distance between adjacent pixels, and k is an integer of at least one.

4. The optical condition design method for a compound-eye imaging device according to claim 3, wherein the evaluating step calculates sum area of the unit surfaces containing at least one pixel observation point, and calculates ratio of the sum area to total area of the imaginary object planes, and evaluates the dispersion of the pixel observation points by using the ratio of the sum area to the total area of the imaginary object planes.

5. The optical condition design method for a compound-eye imaging device according to claim 3, wherein the evaluating step calculates the number of pixel observation points of each unit surface as a local density of the each unit surface, and evaluates the dispersion of the pixel observation points using variance of the local densities of the unit surfaces.

6. The optical condition design method for a compound-eye imaging device according to claim 2, wherein the evaluating step calculates sum area of the unit surfaces containing at least one pixel observation point, and calculates ratio of the sum area to total area of the imaginary object planes, and evaluates the dispersion of the pixel observation points by using the ratio of the sum area to the total area of the imaginary object planes.

7. The optical condition design method for a compound-eye imaging device according to claim 2, wherein the evaluating step calculates the number of pixel observation points of each unit surface as a local density of the each unit surface, and evaluates the dispersion of the pixel observation points using variance of the local densities of the unit surfaces.

8. The optical condition design method for a compound-eye imaging device according to claim 1, wherein the evaluating step calculates sum area of the unit surfaces containing at least one pixel observation point, and calculates ratio of the sum area to total area of the at least one imaginary object plane, and evaluates the dispersion of the pixel observation points by using the ratio of the sum area to the total area of the at least one imaginary object plane.

9. The optical condition design method for a compound-eye imaging device according to claim 1, wherein the evaluating step calculates the number of pixel observation points of each unit surface as a local density of the each unit surface, and evaluates the dispersion of the pixel observation points using variance of the local densities of the unit surfaces.

* * * * *